(12) United States Patent
Fujii

(10) Patent No.: US 6,228,766 B1
(45) Date of Patent: *May 8, 2001

(54) PROCESS FOR FABRICATING SEMICONDUCTOR DEVICE WITHOUT SEPARATION BETWEEN SILICIDE LAYER AND INSULATING LAYER

(75) Inventor: Kunihiro Fujii, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/010,188

(22) Filed: Jan. 21, 1998

(30) Foreign Application Priority Data

Jan. 23, 1997 (JP) .................................................. 9-009933

(51) Int. Cl.$^7$ ........................ H01L 21/44; H01L 21/4763; H01L 21/8238; H01L 21/48; H01L 21/50

(52) U.S. Cl. .......................... 438/682; 438/683; 438/110; 438/113; 438/643; 438/651; 438/655; 438/664; 438/199

(58) Field of Search ..................... 438/648, 649, 438/650, 651, 655, 682, 683, 210, 199, 200, 201, 110, 113, 656, 664, 660, 114

(56) References Cited

U.S. PATENT DOCUMENTS

| 5,187,122 | 2/1993 | Bonis ................... 437/200 |
| 5,302,552 | 4/1994 | Duchateau et al. ........... 438/664 |
| 5,652,183 | 7/1997 | Fujii ..................... 437/200 |
| 5,705,845 | 1/1998 | Fujii ..................... 257/412 |
| 5,712,196 | 1/1998 | Ibok ..................... 437/200 |

FOREIGN PATENT DOCUMENTS

| 54-129882 | 10/1979 | (JP) . |
| 4-165667 | 6/1992 | (JP) . |
| 4-188832 | 7/1992 | (JP) . |
| 7-249684 | 9/1995 | (JP) . |

OTHER PUBLICATIONS

Révész et al. "Growth of titanium silicide on ion–implanted silicon" *Journal Applied Physics* pp. 1860–1864 (1983).

Park et al., Effects of ion implantation doping on the formation of TiSi$^2$ *Journal Vacuum Science and Technologies* pp. 264–268. (1984).

Primary Examiner—Charles Bowers
Assistant Examiner—Thanhha Pham
(74) Attorney, Agent, or Firm—Foley & Lardner

(57) ABSTRACT

Dopant impurities are ion implanted into active areas assigned to field effect transistors, and, thereafter, titanium silicide layers are formed from a titanium layer on the doped regions; when the dopant impurities are ion implanted into the doped regions, photo resist ion-implantation masks prevent a wide inactive area not assigned to any circuit component from the dopant impurities, and a thick titanium silicide is also grown on the wide inactive area; even when the titanium silicide layers are annealed with heat, the thick titanium silicide layer on the wide inactive area is not seriously coagulated, and an inter-level insulating layer is hardly separated from the titanium silicide layer on the wide inactive area.

12 Claims, 9 Drawing Sheets

PROCESS FOR FABRICATING SEMICONDUCTOR DEVICE WITHOUT SEPARATION BETWEEN SILICIDE LAYER AND INSULATING LAYER

FIELD OF THE INVENTION

This invention relates to a fabrication technology for a semiconductor integrated circuit device and, more particularly, to a process for fabricating a semiconductor device without separation between a silicide layer and an insulating layer.

DESCRIPTION OF THE RELATED ART

The semiconductor integrated circuit device has been increased in integration density, and, accordingly, the circuit components are miniaturized. A field effect transistor has a narrow gate electrode and shallow source/drain regions, and the narrow gate electrode and the shallow source/drain regions encounter a problem in larger resistance. The large resistance retards the signal propagation, and the integrated circuit can not achieve a signal processing speed to be expected.

A salicide (self-aligned silicide) structure is proposed for reducing the resistance. Titanium is used for the salicide structure, because titanium silicide has the lowest resistivity of presently available silicides. FIGS. 1A to 1H illustrate the prior art process for fabricating a MOS (metal-oxide-semiconductor) field effect transistor with the salicide structure.

The prior art process starts with preparation of a p-type silicon substrate 1, and n-type well 2 is formed in a surface portion of the p-type silicon substrate 1. Silicon oxide is selectively grown on the major surface of the p-type silicon substrate 1, and forms a field oxide layer 3. The field oxide layer 3 defines active areas 4 assigned to MOS field effect transistors and an inactive area 5 assigned to a scribe region. The active areas 4 and the inactive area 5 are thermally oxidized so as to grow thin gate oxide layers 6 and 7, and polysilicon is deposited over the entire surface of the resultant semiconductor structure. Phosphorous is introduced into the polysilicon layer so as to reduce the resistivity.

A photo-resist etching mask (not shown) is patterned on the polysilicon layer by using photo-lithographic techniques, and the polysilicon layer is selectively removed by using a dry etching technique. Thus, the polysilicon layer is patterned into gate electrodes 8 and 9 on the thin gate oxide layers 6/7. The photo-resist etching mask is stripped off.

A photo-resist ion-implantation mask 10 is patterned on the resultant semiconductor structure by using the photo-lithographic techniques, and the n-type well 2 is covered with the photo-resist ion-implantation mask 10. Phosphorous is ion implanted into the p-type silicon substrate 1, and lightly doped n-type regions 11, 12 and 13 are formed in the active area 4 and the inactive area 5. The lightly-doped n-type regions 11 and 12 are self-aligned with the gate electrode 8. The resultant semiconductor structure is shown in FIG. 1A. The photo-resist ion-implantation mask 10 is stripped off.

A photo-resist ion-implantation mask 14 is patterned on the resultant semiconductor structure by using the photo-lithographic techniques, and the n-type well 2 is uncovered with the photo resist ion-implantation mask 14. The photo-resist ion-implantation mask 14 is the inversion of the photo-resist ion-implantation mask 10, because the photo-masks (not shown) are easily designed. For this reason, the phosphorous is ion implanted into the inactive area 5. Boron is ion implanted into the n-type well 2, and p-type impurity regions 15a/16a are formed in the n-type well 2 in a self-aligned manner with the gate electrode 9 as shown in FIG. 1B. The photo-resist ion-implantation mask 14 is stripped off.

Silicon oxide or silicon nitride is deposited over the entire surface of the resultant semiconductor structure, and the silicon oxide layer or the silicon nitride layer is anisotropically etched so as to form side wall spacers 15/16 on both sides of the gate electrodes 8/9. Silicon oxide is deposited over the entire surface of the resultant semiconductor structure, and forms a covering layer 17.

A photo-resist ion-implantation mask 18 is patterned on the covering layer 17, and the n-type well 2 is covered with the photo-resist ion-implantation mask 18. Arsenic is ion implanted into the active area 4 and the inactive area 5, and heavily-doped n-type impurity regions 19, 20 and 21 are formed therein. The heavily-doped n-type impurity regions 19/20 are self-aligned with the side wall spacers 15, and form source/drain regions 22/23 together with the lightly-doped n-type impurity regions 11/12. The source/drain regions 22/23 have the LDD (lightly doped drain) structure. The photo-resist ion-implantation mask 18 is the inversion of the photo-resist ion-implantation mask 14, and the arsenic is also ion implanted into the inactive area 5. For this reason, the lightly-doped n-type impurity region 13 is laminated with the heavily-doped n-type impurity region 21. The resultant semiconductor structure is shown in FIG. C. The photo-resist ion-implantation mask 18 is stripped off.

A photo-resist ion-implantation mask 22 is patterned on the covering layer 17, and is the inversion of the photo-resist ion-implantation mask 18. Boron is ion implanted into the n-type well, and heavily-doped p-type impurity regions 23/24 are formed in a self-aligned manner with the side wall spacers 16. The heavily-doped p-type impurity regions 23/24 form p-type source/drain regions 25/26 together with the lightly doped p-type impurity regions 15/16. The p-type source/drain regions 25/26 have the LDD structure. The photo-resist ion-implantation mask 22 is stripped off.

Arsenic is ion implanted into the surface portions of the n-type source/drain regions 22/23, the surface portions of the p-type source/drain regions 25/26 and the surface portions of the polysilicon gate electrodes 8/9 so as to produce amorphous silicon layers 27, 28, 29, 30, 31 and 32. The ion-implantation of arsenic also forms an amorphous silicon layer 33 in the heavily doped n-type impurity region 21. The resultant semiconductor structure is shown in FIG. 1E.

Subsequently, the covering layer 17 is removed from the resultant semiconductor structure, and titanium is deposited over the entire surface of the resultant semiconductor structure by using a sputtering. The titanium forms a titanium layer 34, and is held in contact with the amorphous silicon layers 27 to 33 as shown in FIG. 1F.

The resultant semiconductor structure is placed in nitrogen ambience, and is heated to 700 degrees in centigrade or less by using a rapid thermal annealing technique. Then, the titanium reacts with the amorphous silicon, and titanium silicide layers 35, 36, 37, 38, 39, 40 and 41 are formed on the silicon/polysilicon layers 22, 8, 23, 25, 9, 26 and 21, respectively. The residual titanium reacts with the nitrogen, and is converted to a titanium nitride layer 42 as shown in FIG. 1G.

The titanium nitride layer 42 is etched away in wet etchant containing aqueous ammonia and hydrogen peroxide. The titanium silicide layers 35 to 41 are left on the silicon/ polysilicon layers 22, 8, 23, 25, 9, 26 and 21. The titanium silicide layers 35 to 41 are rapidly annealed at higher temperature than the previous rapid thermal annealing. Then, the change of phase takes place in the titanium silicide layers 35 to 41, and the resistivity of titanium silicide is decreased.

Undoped silicon oxide is deposited over the entire surface of the resultant semiconductor structure, and forms a silicon oxide layer 43. Borophosphosilicate glass, phosphosilicate glass or boro-phosphosilicate glass is deposited over the undoped silicon oxide layer 43, and forms an inter-level insulating layer 44. The inter-level insulating layer 44 is heated to about 800 degrees in centigrade for increasing the density. The undoped silicon oxide layer 43 and the inter-level insulating layer 44 as a whole constitute an inter-level insulating structure 45 as shown in FIG. 1H.

The titanium layer 34 is converted to the titanium silicide layers 35 to 41 in a self-aligned manner with the amorphous silicon layers 27 to 33, and the titanium silicide layers 35 to 41 and the silicon/polysilicon layers form the salicide structure. The salicide structure decreases the resistance, and accelerates signal propagation. However, the prior art process encounters a problem in that the inter-level insulating structure 45 is liable to be peel from the wide titanium silicide layer 41. This is because of the fact that the heat treatment for the change of phase tends to coagulate the titanium silicide layers like islands.

SUMMARY OF THE INVENTION

It is therefore an important object of the present invention to provide a process of fabricating a salicide structure which prevents an inter-level insulating structure from peeling from a silicide layer.

The present inventor contemplated the problem, and investigated the coagulating phenomenon. When dopant impurity such as arsenic, phosphorous or antimony was ion implanted into silicon, the dopant impurity impeded the reaction between the titanium and the silicon, and made the titanium silicide layer thin as reported in "Growth of titanium silicide on ion-implanted silicon", Journal of Applied Physics, 1983, pages 1860 to 1864. If the ion-implanted dopant impurity was increased, the impedance became serious, and the titanium silicide layer was made thin as reported in "Effects of ion implantation doping on the formation of $TiSi_2$", Journal of Vacuum Science and Technologies, 1984, pages 264 to 268. The thin titanium silicide layer was much liable to be coagulated over doped silicon during a heat treatment rather than undoped silicon. Although the titanium silicide layers over the active area were also coagulated, the titanium silicide layers hardly peeled, because the titanium silicide layers were less than hundreds $\mu m\square$.

The present inventor further investigated effects of area on the thickness of a titanium silicide layer. The titanium silicide layer became thicker over the narrow active area rather than the wide inactive area. The amorphous silicon promoted the reaction with the titanium, and the thickness of titanium silicide layer was proportional to the thickness of the amorphous silicon layer. However, while the covering layer 17 of silicon oxide was being etched before the deposition of the titanium, the amorphous silicon was partially etched away, and the amount of amorphous silicon etched was proportional to the area of the amorphous silicon layer. This phenomenon was derived from the influence of the field oxide layer. The amorphous silicon layer was narrow in the active area, and the central portion of the active area was close to the thick field oxide layer. On the other hand, the amorphous silicon layer was wide in the inactive area, and the central portion of the inactive area was spaced from the thick field oxide layer. When the covering layer 17 was etched away, the etchant was consumed for etching the thick field oxide layer in the active area, and the amorphous silicon layer was less etched away. However, the etchant hardly reached the thick field oxide layer in the inactive area, and was consumed for the amorphous silicon layer. For this reason, the amorphous silicon layer in the active area was thicker than the amorphous silicon layer in the inactive area, and, accordingly, the titanium silicide layer over the active area was thicker than the titanium silicide layer over the inactive area.

The present inventor investigated influences of ion-implanted dopant impurity on the adhesion between the inter-level insulating layer and the titanium silicide layer as follows. The present inventor grew a thick field oxide layer on a 6-inch silicon wafer 50 (see FIG. 2), and the thick field oxide layer defined active areas in a central zone 51 and an inactive peripheral area 52 indicated by hatching lines. Scribe lines 53 extended like lattice, and the scribe lines 53 and the inactive peripheral area 52 were uncovered with the thick field oxide layer. The widest active area was 50 $\mu m\uparrow$, and the scribe lines 53 were 100 microns in width. Arsenic was ion implanted into one of the silicon wafers 50, which was referred to as "first specimen", at does of $3\times10^{15}$ cm$^{-2}$ under acceleration energy of 50 KeV. Boron fluoride was ion implanted into another silicon wafer 50, which was referred to as "second specimen", at dose of $3\times10^{15}$ cm$^{-2}$ under acceleration energy of 30 KeV. Arsenic and boron fluoride were ion implanted into yet another silicon wafer, which was referred to as "third specimen" under the above-described conditions. Neither arsenic nor boron fluoride was ion implanted into still another silicon wafer, which was referred to as "fourth specimen", and only the central zone was doped through ion-implantation. The first specimen to the fourth specimen were treated with heat for activating the ion-implanted dopant impurity, and arsenic was ion implanted into the first specimen to the fourth specimen at dose of $3\times10^{14}$cm$^{-2}$ under acceleration energy of 30 KeV so as to form amorphous silicon layers.

Silicon oxide was removed from the amorphous silicon layers, and produced titanium silicide layers as similar to the prior art process. Inter-level insulating layers were deposited over the silicon wafers, and were heated to 840 degrees in centigrade for 10 seconds.

The present inventor observed the first specimen to the fourth specimen to see whether or not the inter-level insulating layer peeled from the titanium silicide layer. The inter-level insulating layer peeled from the titanium silicide layers in the inactive peripheral area 52 and on the scribe lines 53 in each of the first specimen, the second specimen and the third specimen. However, the inter-level insulating layer did not peel from the titanium silicide layer in the active areas in the central zone. Especially, the inter-level insulating layer seriously peeled from the titanium silicide layers in the third specimen. On the other hand, the inter-level insulating layer did not peel from the titanium silicide layers in the fourth specimen.

The present inventor measured the resistivity of the titanium silicide layer. The first specimen was 4.6 $\Omega/\square$, the second specimen was 4.3 $\Omega/\square$, the third specimen was 6.1 $\Omega/\square$, and the fourth specimen was 4.0 $\Omega/\square$. The ion-implanted arsenic and the ion-implanted boron fluoride decreased the thickness of the titanium silicide layers so as to increase the resistivity.

The present inventor concluded that the ion-implanted dopant impurity was undesirable for the adhesion and the resistivity.

To accomplish the object, the present invention proposes to prevent a wide inactive area from dopant impurity ion implanted thereinto.

In accordance with one aspect of the present invention, there is provided a process for fabricating a semiconductor device, comprising the steps of a) preparing a silicon substrate, b) selectively forming a field insulating layer on a major surface of the silicon substrate so as to define a narrow active area assigned to a circuit component and a wide inactive area not assigned to any circuit component, c) forming a first ion-implantation mask on the major surface so as to cover the wide inactive area therewith and uncover the narrow active area therewith, d) ion implanting a first dopant impurity into the narrow active area so as to form first doped regions forming parts of the circuit component, e) removing the first ion-implantation mask, f) depositing a metal layer on at least the first doped regions, and g) causing the metal layer to react with the silicon of the first doped regions under application of heat for forming conductive metal silicide layers.

BRIEF DESCRIPTION OF THE DRAWINGS

The features and advantages of the process will be more clearly understood from the following description taken in conjunction with the accompanying drawings in which.

DESCRIPTION OF THE PREFERRED EMBODIMENTS

First Embodiment

Figure 1A:
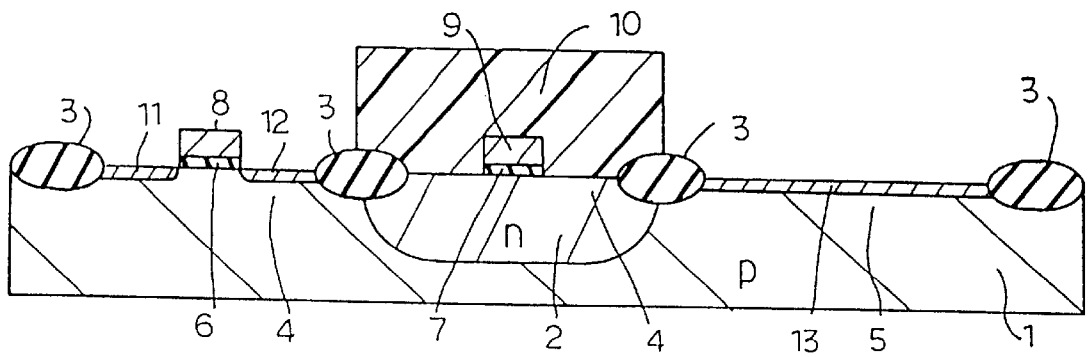
FIGS. 1A to 1H are cross sectional view showing the prior art process for fabricating the semiconductor device with the salicide structure.
Figure 1B:
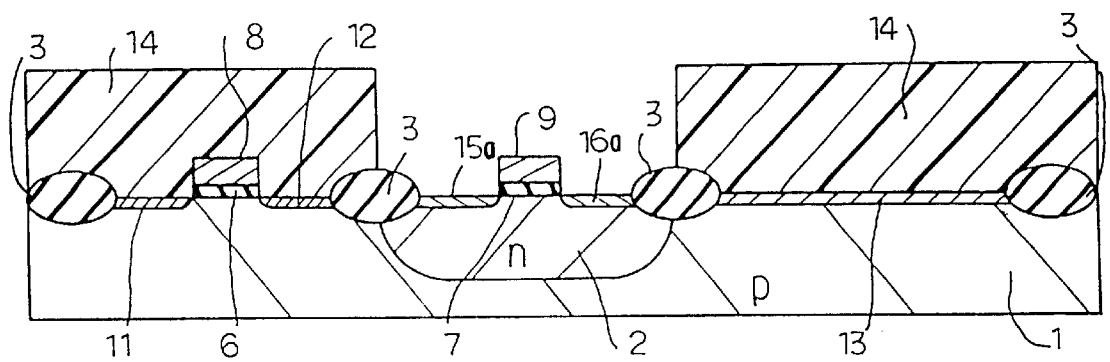
Figure 1C:
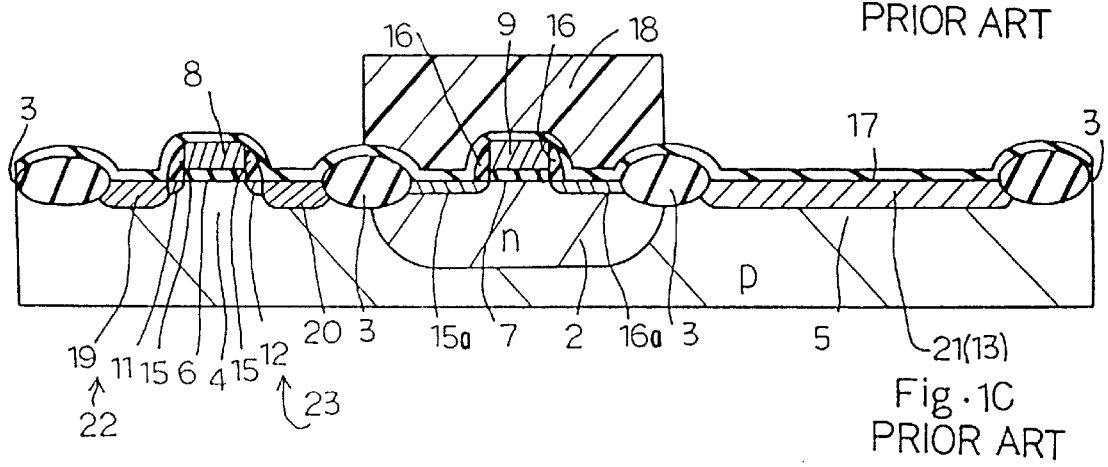
Figure 1D:
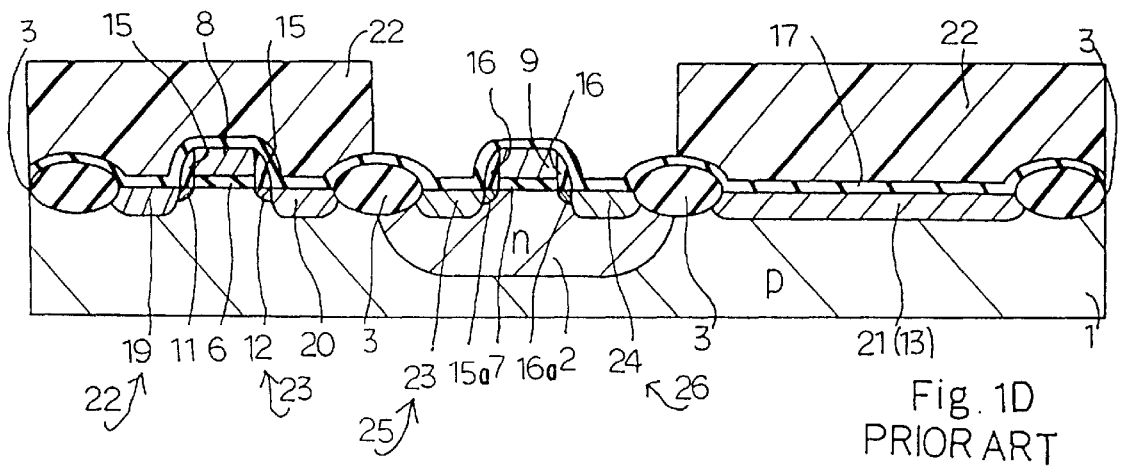
Figure 1E:
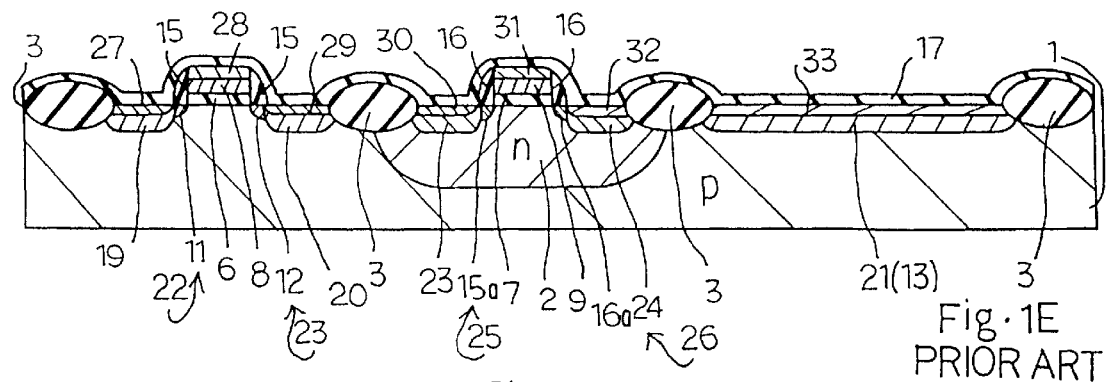
Figure 1F:
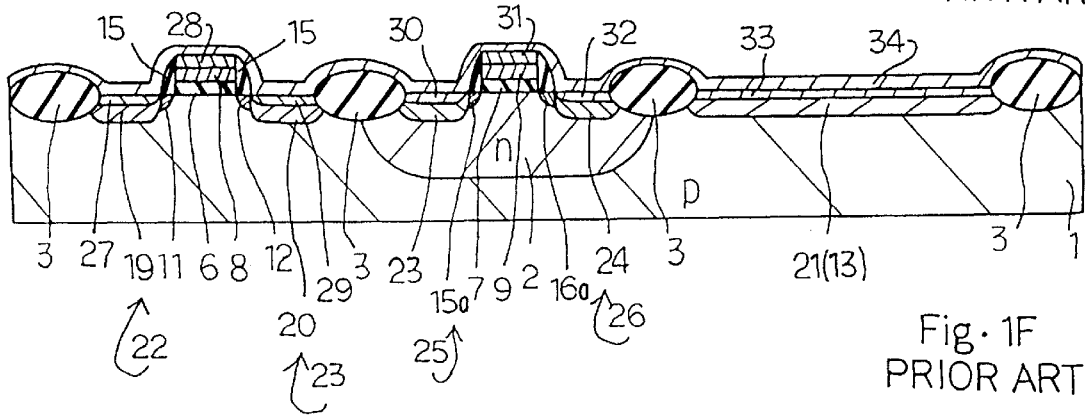
Figure 1G:
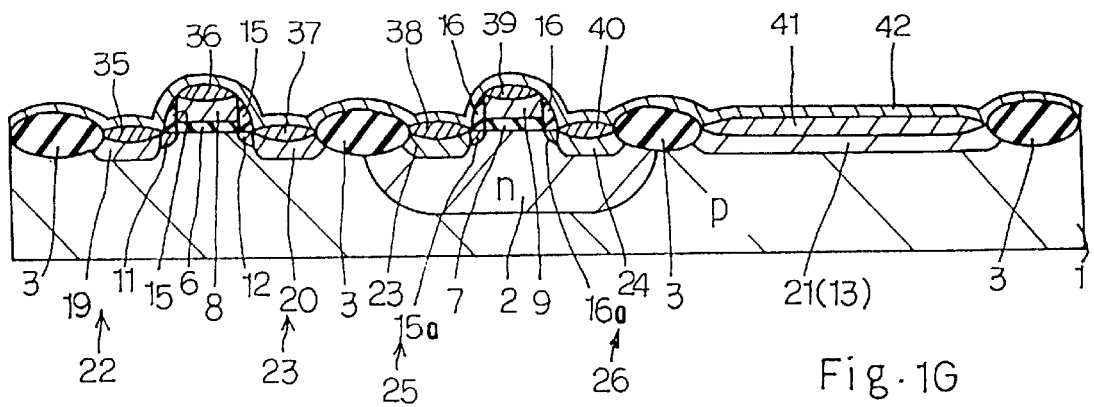
Figure 1H:
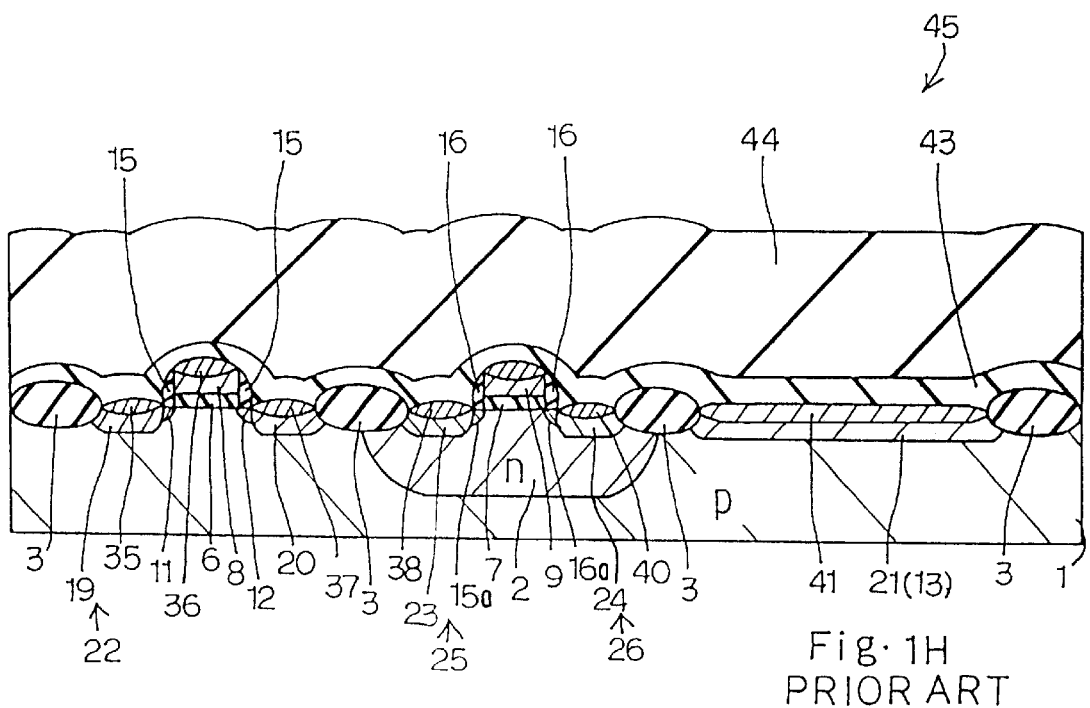
Figure 2:
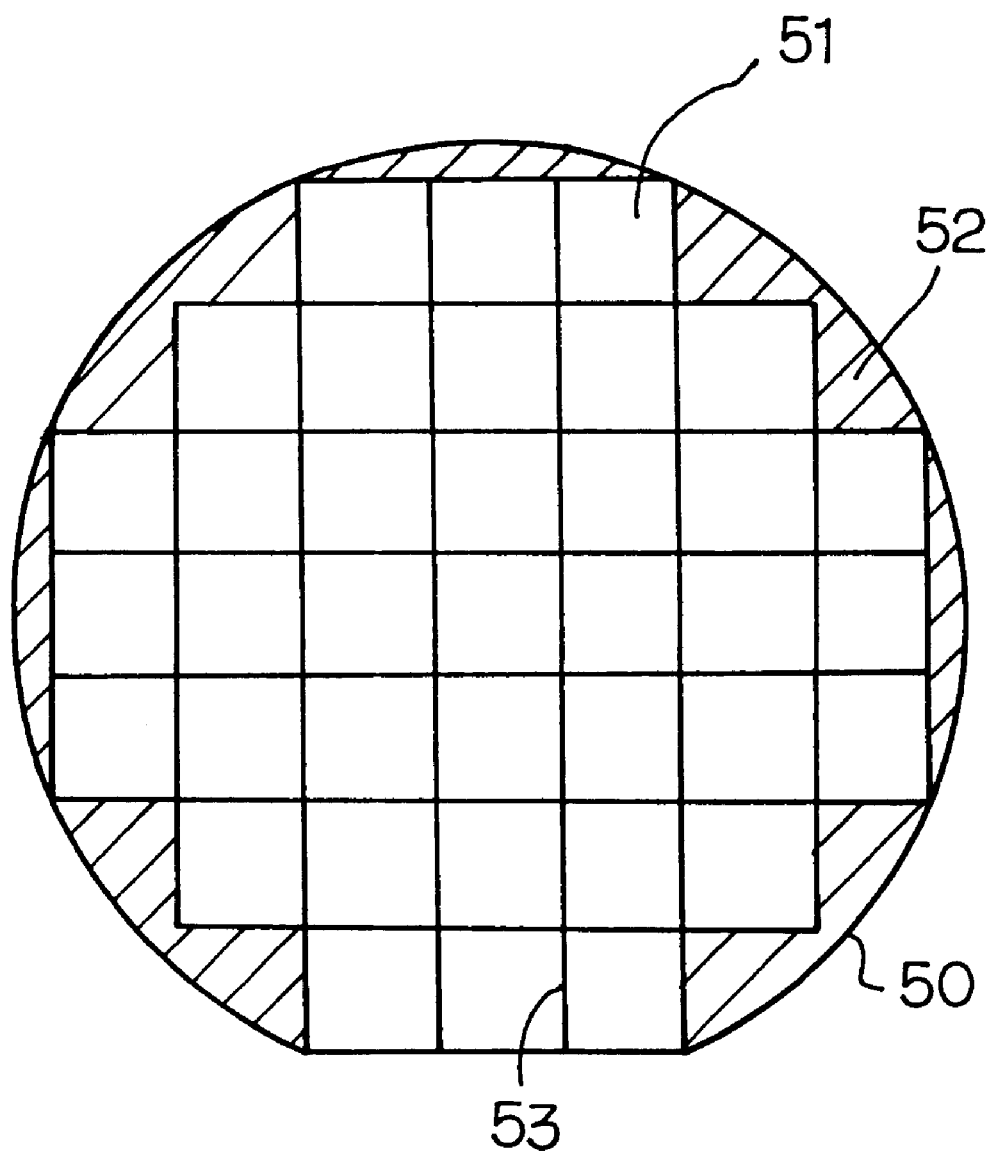
FIG. 2 is a plane view showing the silicon wafer used for the investigation.

FIGS. 3A to 3H illustrate a process for fabricating a semiconductor device embodying the present invention. The process starts with preparation of a p-type single crystalline silicon substrate 60. N-type dopant impurity is ion implanted into a surface portion of the p-type silicon substrate 60, and forms an n-type well 61.

A thick field oxide layer 62 is selectively grown to 300 nanometers thick on the major surface of the p-type silicon substrate 60. The thick field oxide layer 62 defines narrow active areas 60a/60b and a wide inactive area 60c in the major surface of the p-type silicon substrate 60. The active areas 60a/60b are respectively assigned to an n-channel type field effect transistor and a p-channel type field effect transistor. However, the inactive area 60c is not assigned to any circuit component. Scribe lines (not shown) are formed in the inactive area 60c.

Silicon oxide is thermally grown to 6 nanometers thick on the active areas 60a/60b and the inactive area 60c, and the silicon oxide layers in the active areas 60a/60b serve as gate insulating layers 63/64. Polysilicon is deposited to 150 nanometers thick over the entire surface of the resultant semiconductor structure by using a chemical vapor deposition, and the silicon oxide layers are covered with a polysilicon layer.

Photo resist solution is spun onto the polysilicon layer, and is baked so as to form a photo resist layer. A pattern image for gate electrodes is transferred from a photo mask (not shown) to the photo resist layer, and forms a latent image in the photo resist layer. The latent image is developed so as to form a photo resist etching mask (not shown) on the polysilicon layer. Thus, the photo resist etching mask is patterned on the polysilicon layer by using photo-lithographic techniques. Using the photo resist etching mask, the polysilicon layer is selectively removed by using a dry etching, and the silicon oxide layers are also selectively etched away. As a result, gate electrodes 65/66 are formed on the gate insulating layers 63/64, respectively.

A photo resist ion-implantation mask 67 is patterned on the resultant semi-conductor structure by using the photo-lithographic techniques. The active area 60a is uncovered with the photo resist ion-implantation mask 67, and the active area 60b and the inactive area 60c are covered with the photo resist ion-implantation mask 67.

Figure 3A:
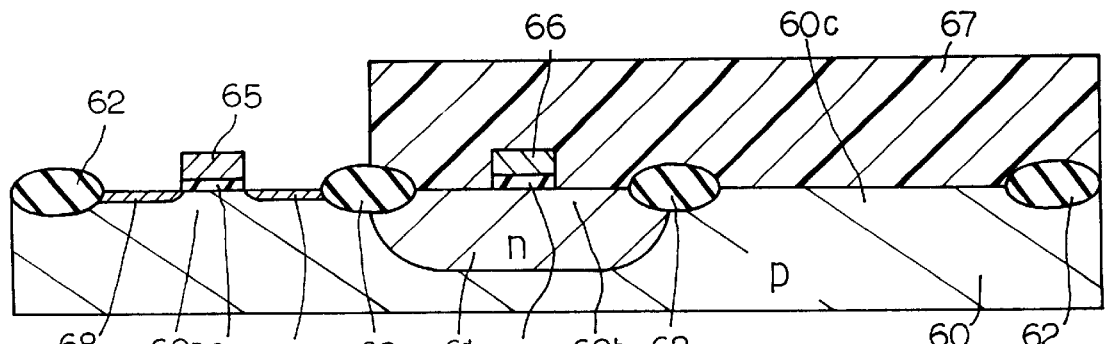
FIGS. 3A to 3H are cross sectional view showing a process of fabricating a semiconductor device with a salicide structure.

Using the photo resist ion-implantation mask 67, phosphorous is ion implanted into the active area 60a at dose of $5 \times 10^{13}$ cm$^{-2}$ under acceleration energy of 30 KeV, and forms lightly doped n-type impurity regions 68/69 in a self-aligned manner with the gate electrode 65 as shown in FIG. 3A. After the ion-implantation, the photo resist ion-implantation mask 67 is stripped off A photo resist ion-implantation mask 70 is patterned on the resultant semiconductor structure by using the photo-lithographic techniques. The active area 60b or the n-type well 61 is uncovered with the photo-resist ion-implantation mask 70. However, the active area 60a and the inactive area 60c are covered with the photo resist ion-implantation mask 70.

Figure 3B:
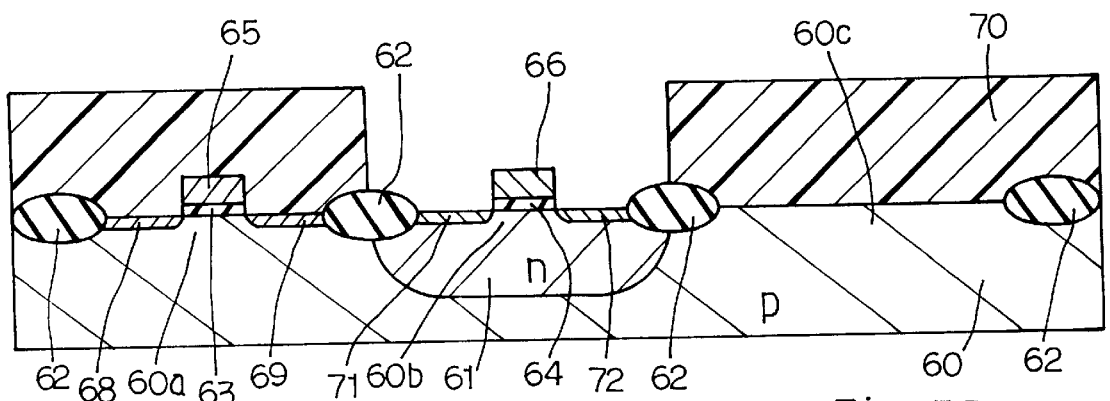

Boron difluoride (BF$_2$) is ion implanted into the active area 60b at dose of $5 \times 10^{13}$ cm$^{-2}$ under acceleration energy of 20 KeV, and p-type impurity regions 71/72 are formed in the n-type well 61 in a self-aligned manner with the gate electrode 66 as shown in FIG. 3B. After the ion-implantation, the photo resist ion-implantation mask 70 is stripped off.

Silicon oxide is deposited to 70 nanometers thick over the entire surface of the resultant semiconductor structure by using a chemical vapor deposition, and the silicon oxide layer is etched back so as to form side wall spacers 73/74 on both sides of the gate electrodes 65/66. Silicon oxide is deposited to 10 nanometers thick over the entire surface of the resultant semiconductor structure, and forms a covering layer 75.

Figure 3C:
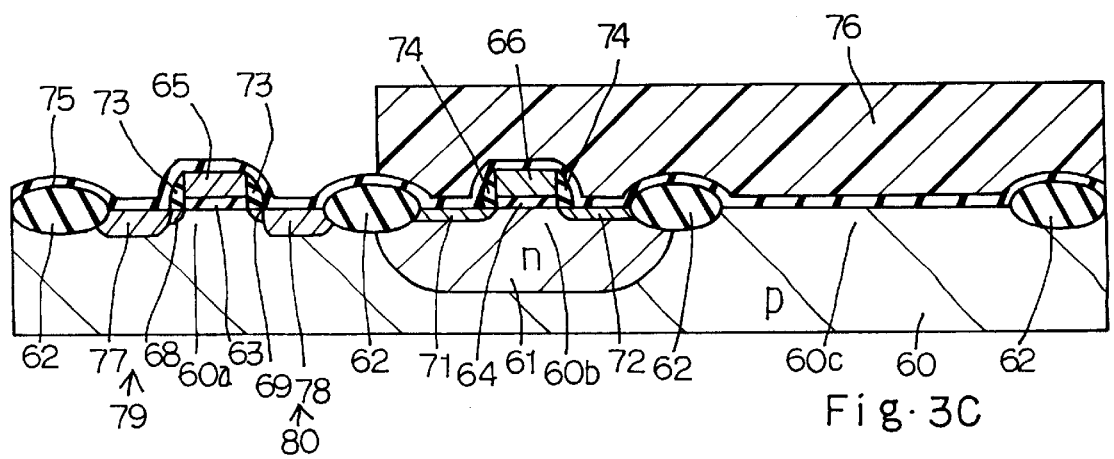

A photo resist ion-implantation mask 76 is patterned on the covering layer 75 by using the photo-lithographic techniques, and the active area 60b and the inactive area 60c are covered with the photo-resist ion-implantation mask 76. The active area 60a is uncovered with the photo resist ion-implantation mask 76. Arsenic is ion implanted into the active area 60a at dose of $3 \times 10^{15}$ cm$^{-2}$ under acceleration energy of 50 KeV, and forms heavily-doped n-type impurity regions 77/78. The heavily-doped n-type impurity regions 77/78 are self-aligned aligned with the side wall spacers 73, and form source/drain regions 79/80 together with the lightly-doped-n-type impurity regions 68/69. The source/drain regions 79/80 have the LDD structure. The arsenic is also ion implanted into the gate electrode 65, and reduces the resistance of the gate electrode 65. However, the photo resist ion-implantation mask 76 prevents the inactive area 60c from the arsenic, and any n-type impurity region is not formed in the inactive area 60c. The resultant semiconductor structure is shown in FIG. 3C. The photo-resist ion-implantation mask 76 is stripped off after the ion-implantation for the heavily-doped n-type impurity regions 77/78.

Figure 3D:
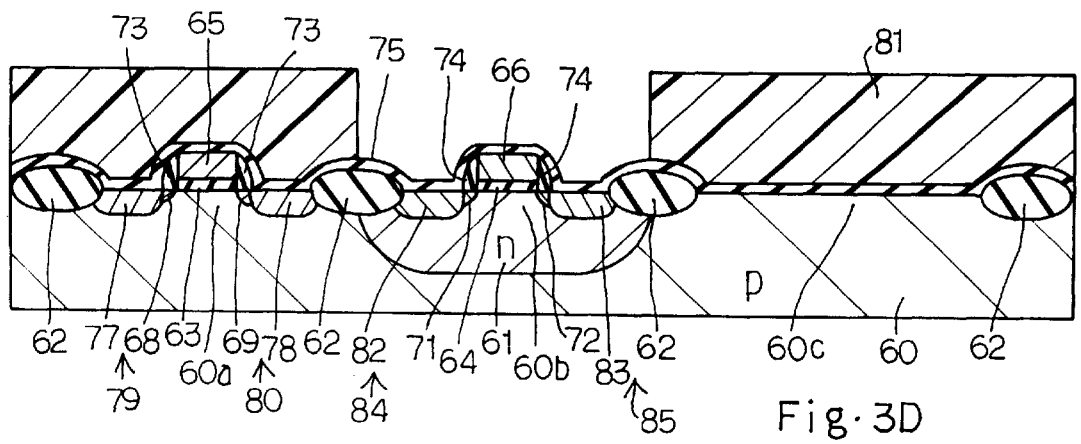

A photo-resist ion-implantation mask 81 is patterned on the covering layer 75 by using the photo-lithographic techniques. Boron fluoride is ion implanted into the active area 60b at dose of $3\times10^{15}$ cm$^{-2}$ under acceleration energy of 30 KeV, and heavily-doped p-type impurity regions 82/83 are formed in a self-aligned manner with the side wall spacers 74 as shown in FIG. 3D. The heavily-doped p-type impurity regions 82/83 form p-type source/drain regions 84/85 together with the lightly doped p-type impurity regions 71/72. The p-type source/drain regions 84/85 have the LDD structure. The boron fluoride is also ion implanted into the gate electrode 66, and reduces the resistivity of the poly-silicon gate electrode 66. However the photo resist ion-implantation mask 81 prevents the inactive area 60c from the boron difluoride. The photo-resist ion-implantation mask 81 is stripped off after the ion-implantation.

The n-type source/drain regions 79/80 and the p-type source/drain regions 84/85 are annealed at 9000 degrees in centigrade for 20 minutes in nitrogen atmosphere. Then, the silicon crystal is cured, and the ion-implanted dopant impurities are activated.

Figure 3E:
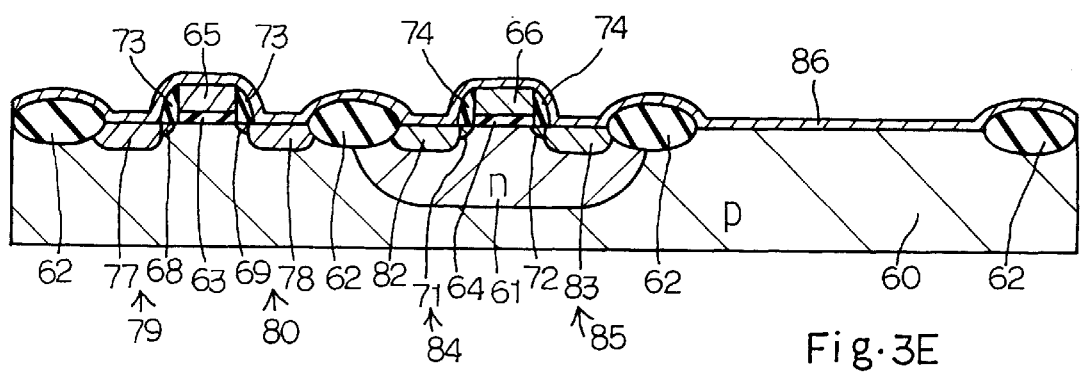

The covering layer 75 is removed by using a dry etching, and titanium is deposited to 30 nanometers thick over the entire surface of the resultant semiconductor structure by using a sputtering. Thus, the titanium layer 86 is laminated on the entire surface as shown in FIG. 3E without an ion-implantation for amorphousization.

Figure 3F:
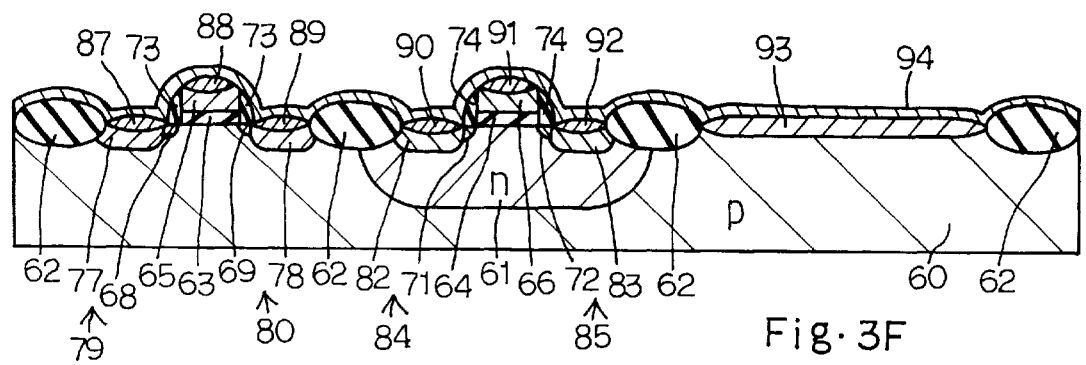

The titanium layer 86 is heated to 650 degrees in centigrade for 30 seconds by using a rapid thermal annealing, and the titanium reacts with the silicon so as to produce titanium silicide layers as shown in FIG. 3F. The remaining titanium reacts with the nitrogen, and forms a titanium nitride layer 94.

Figure 3G:
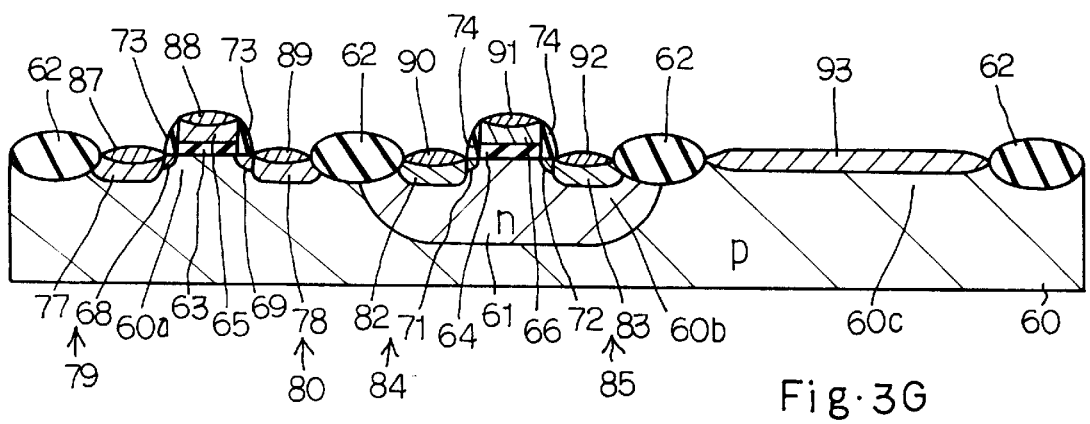
Figure 3H:
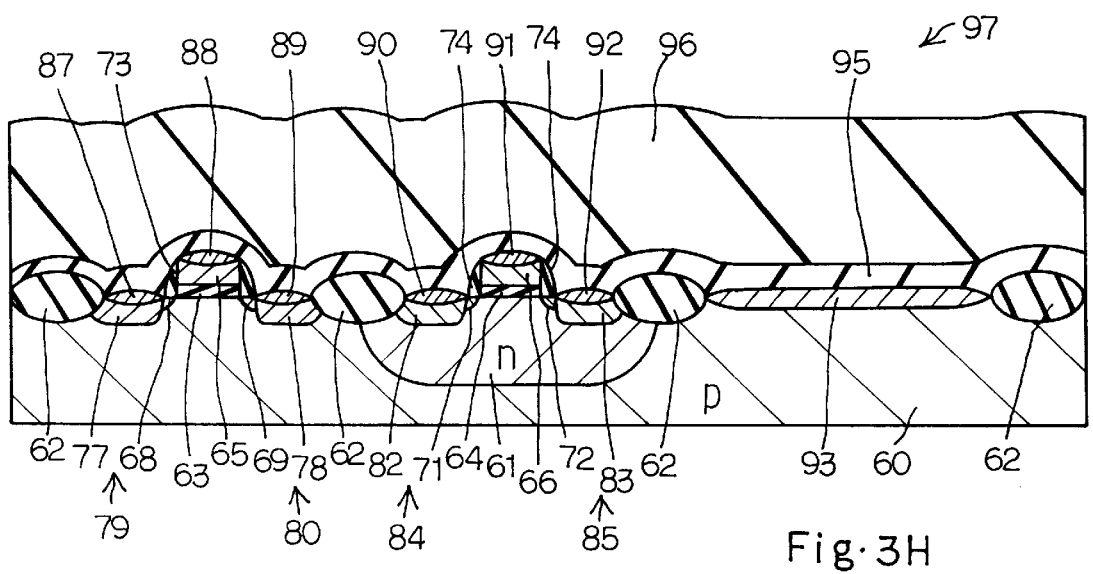

The titanium nitride layer 94 is etched away by using wet etchant containing aqueous ammonia and hydrogen peroxide. The titanium silicide layers 87 to 93 are left on the silicon/polysilicon layers 79, 65, 80, 84, 66, 85 and 60c as shown in FIG. 3G. The titanium silicide layers 87 to 93 are rapidly annealed at 850 degrees in centigrade for 10 seconds, and are reduced in resistivity.

Undoped silicon oxide is deposited over the entire surface of the resultant semiconductor structure, and forms a silicon oxide layer 95. Boro-phosphosilicate glass, phosphosilicate glass or boro-phosphosilicate glass is deposited over the undoped silicon oxide layer 95, and forms an inter-level insulating layer 96. The inter-level insulating layer 96 is treated with heat for increasing the density. The undoped silicon oxide layer 95 and the inter-level insulating layer 96 as a whole constitute an inter-level insulating structure 97.

The titanium layer 86 is converted to the titanium silicide layers 87 to 93 in a self-aligned manner with the silicon/polysilicon layers, and the titanium silicide layers 87 to 93 and the silicon/polysilicon layers form the salicide structure.

As will be appreciated from the foregoing description, the photo resist ion-implantation masks 76/81 prevent the inactive area 60c from the heavily ion-implanted n-type dopant impurity and the heavily ion-implanted p-type dopant impurity, and the rapid thermal annealing grows the titanium silicide layer 93 thick on the inactive area 60c. For this reason, even through the titanium silicide is heated after the growth, the titanium silicide is not seriously coagulated, and the inter-level insulating layer 97 is strongly adhered to the titanium silicide layers 87 to 93.

Second Embodiment

FIGS. 4A to 4D illustrate another process sequence embodying the present invention. The process embodying the second embodiment is similar to the first embodiment until the completion of the semiconductor structure shown in FIG. 3D, and layers and regions are labeled with the same references designating the corresponding layers and regions shown in FIG. 3D without detailed description.

Figure 4A:
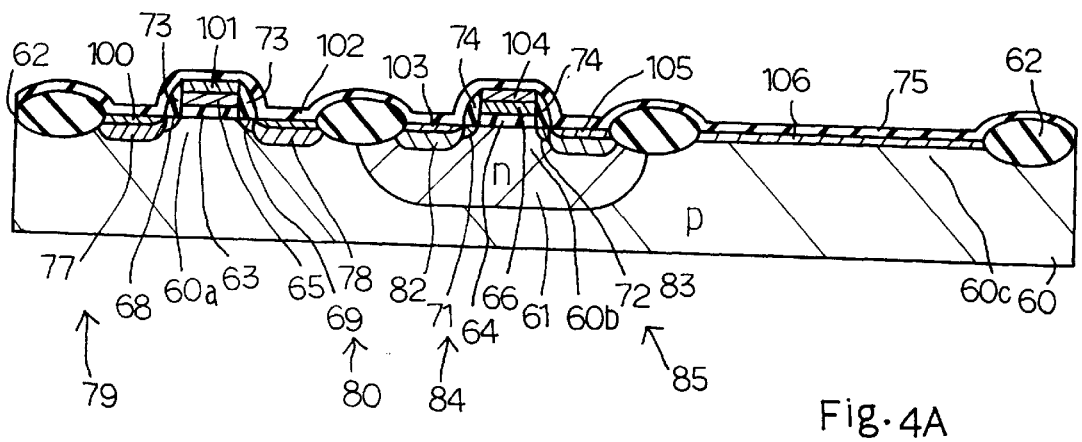
FIGS. 4A to 4D are cross sectional views showing another process of fabricating a semiconductor device with a salicide structure.

Upon completion of the LDD structure for the n-channel type field effect transistor and the p-channel type field effect transistor, arsenic is ion implanted at dose of $3.0\times10^{14}$ cm$^{-2}$ under acceleration energy of 30 KeV without any ion-implantation mask, and amorphous silicon layers 100 to 106 on the n-type source/drain region 79, the gate electrode 65, the n-type source/drain region 80, the p-type source/drain region 84, the gate electrode 66, the p-type source/drain region 85 and the p-type single crystalline inactive area 60c, respectively as shown in FIG. 4A. The amorphous silicon layers 100 to 106 are 30 nanometers in depth, and are expected to promote the reaction between silicon and titanium. Although the arsenic is ion implanted into the p-type source/drain regions 84/85 and the p-type gate electrode 66, the p-type dopant concentration is so high that the arsenic can not change the source/drain regions 84/85 and the gate electrode 66 to n-type.

Figure 4B:
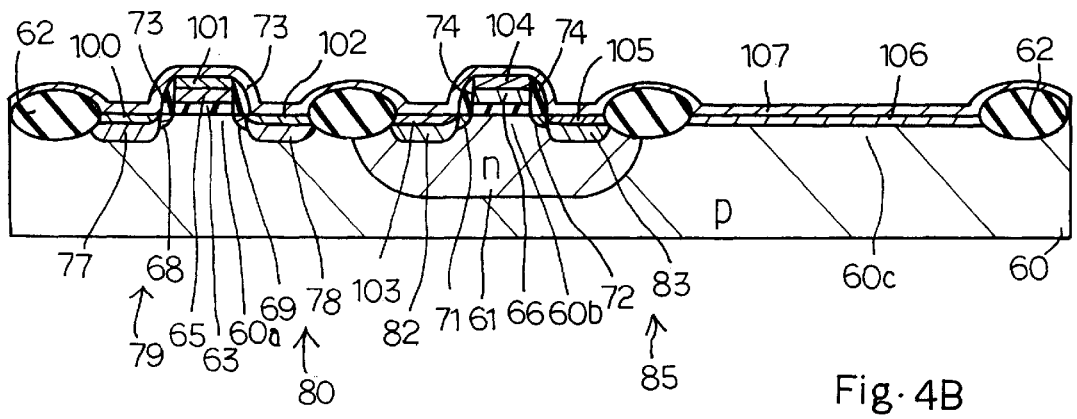

Subsequently, the covering layer 75 is removed by using the dry etching, and titanium is deposited to 30 nanometers thick over the entire surface by using the sputtering. The titanium forms a tantalum layer 107, and the amorphous silicon layers 100 to 106 are held in contact with the titanium layer 107 as shown in FIG. 4B.

Figure 4C:
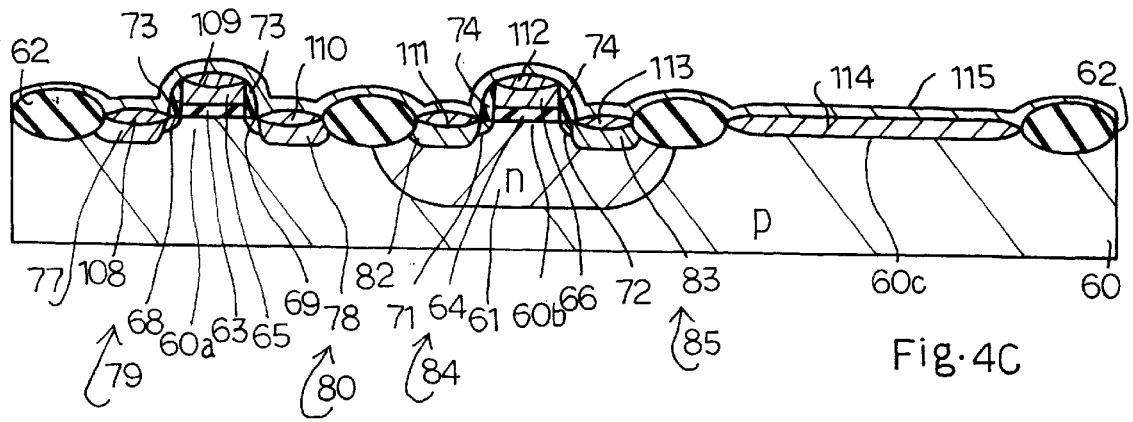
Figure 4D:
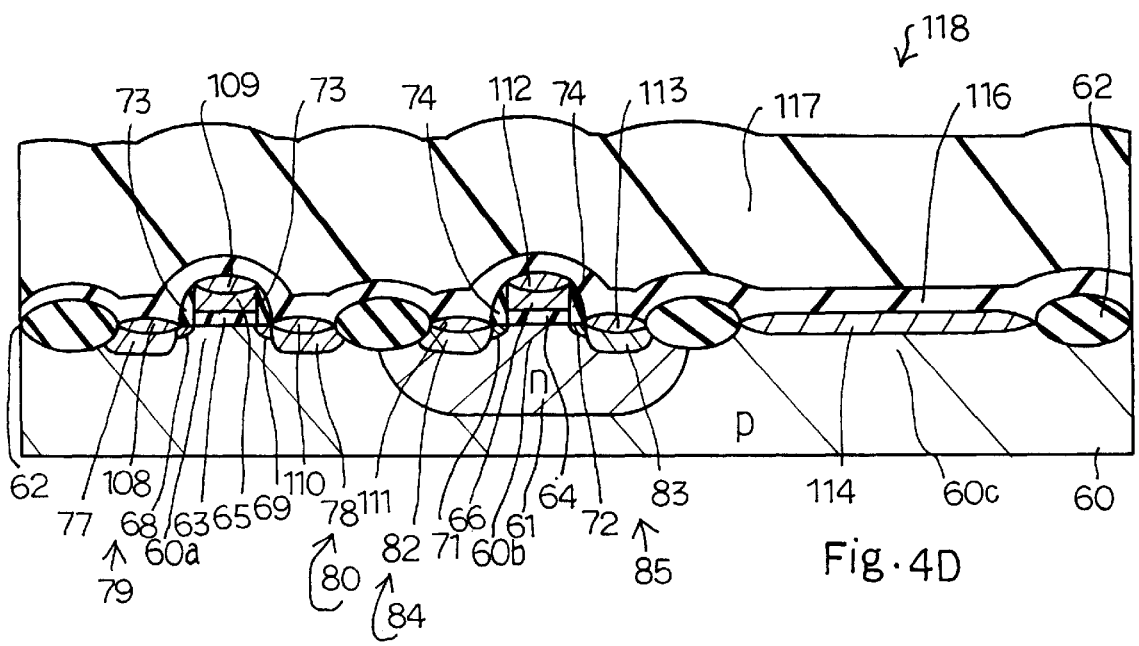

The resultant semiconductor structure is placed in nitrogen ambience, and is heated to 650 degrees in centigrade for 30 seconds by using the rapid thermal annealing. The titanium reacts with the amorphous silicon layers 100 to 106, and titanium silicide layers 108 to 114 are produced in a self-aligned manner with the n-type source/drain region 79, the n-type gate electrode 65, the n-type source/drain region 80, the p-type source/drain region 84, the p-type gate electrode 64, the p-type source/drain region 85 and the single crystalline inactive area 60c, respectively. The residual titanium is converted to a titanium nitride layer 115. The resultant semiconductor structure is shown in FIG. 4C.

The titanium nitride layer 115 is etched away by using wet etchant containing aqueous ammonia and hydrogen peroxide. The titanium silicide layers 108 to 114 are left on the silicon/polysilicon layers 79, 65, 80, 84, 66, 85 and 60c. The titanium silicide layers 108 to 114 are rapidly annealed at 850 degrees in centigrade for 10 seconds, and are reduced in resistivity.

Undoped silicon oxide is deposited over the entire surface of the resultant semiconductor structure, and forms a silicon oxide layer 116. Boro-phosphosilicate glass, phosphosilicate glass or boro-phosphosilicate glass is deposited over the undoped silicon oxide layer 116, and forms an inter-level insulating layer 117. The inter-level insulating layer 117 is treated with heat at 840 degrees in centigrade for 10 seconds so as to increase the density. The undoped silicon oxide layer 116 and the inter-level insulating layer 117 as a whole constitute an inter-level insulating structure 118.

As will be understood from the foregoing description, the amorphous silicon layer 106 promotes the reaction between the silicon and the titanium, and the rapid thermal annealing grows the thick titanium silicide layer 114 on the inactive area 60c prevented from the n-type dopant impurity for the n-type impurity regions 77/78 and the p-type impurity for the p-type impurity regions 82/83. For this reason, even through the titanium silicide is heated after the growth, the titanium silicide is not seriously coagulated, and the inter-level insulating layer 118 is strongly adhered to the titanium silicide layers 108 to 114.

Although particular embodiments of the present invention have been shown and described, it will be obvious to those skilled in the art that various changes and modifications may be made without departing from the spirit and scope of the present invention.

For example, the ion-implantation for the p-type impurity regions may be carried out before the ion-implantation for the n-type impurity regions.

The n-type dopant impurity for the lightly doped n-type regions 68/69 and the p-type dopant impurity for the lightly doped p-type regions 71/72 may be ion implanted into the inactive area 60c, because the dose is 1/10 to 1/100 of the ion-implantations for the heavily doped regions.

The single crystalline silicon and the polysilicon may be amorphosized by using another impurity or an element of IV group such as silicon

What is claimed is:

1. A process for fabricating a semiconductor device, comprising the steps of:
   a) preparing a silicon substrate;
   b) selectively forming a field insulating layer on a major surface of said silicon substrate so as to define a narrow active area assigned to a circuit component and a wide inactive area not assigned to any circuit component positioned either above or below said field insulating layer, said wide inactive area defined by scribe areas on said silicon substrate and
   performing additional process steps without ion-implantation into said wide inactive area, said additional process steps including:
   c) forming a first ion-implantation mask on said major surface so as to cover said wide inactive area therewith and uncover said narrow active area therewith;
   d) ion implanting a first dopant impurity into said narrow active area so as to form first doped regions forming parts of said circuit component;
   e) removing said first ion-implantation mask;
   f) depositing a metal layer on at least said first doped regions;
   g) causing said metal layer to react with the silicon of said first doped regions under application of heat for forming conductive metal silicide layers.

2. The process as set forth in claim 1, in which said first doped regions serve as heavily-doped impurity regions of an LDD structure.

3. The process as set forth in claim 1, further comprising the step of converting a surface of said first doped regions to amorphous silicon layers between said step e) and said step f).

4. The process as set forth in claim 3, in which the conversion to said amorphous silicon layers is carried out by using an ion implantation.

5. The process as set forth in claim 1, further comprising the steps of
   h) forming a gate insulating layer on said narrow active area between said step b) and said step c),
   i) forming a polysilicon gate electrode on said gate insulating layer between said step h) and said step c),
   j) forming a second ion-implantation mask in such a manner as to uncover said narrow active area therewith and cover said wide inactive area therewith between said step i) and said step c),
   k) lightly ion implanting a second dopant impurity into said narrow active area so as to form second doped regions in a self-aligned manner with said polysilicon gate electrode between said step j) and said step c),
   l) removing said second ion-implantation mask between said step k) and said step c), and
   m) forming said wall spacers on both sides of said polysilicon gate electrode between said step l) and said step c), and said first doped regions are formed in a self-aligned manner with said side wall spacers so as to form a LDD structure.

6. The process as set forth in claim 5, further comprising the step of converting a surface of said first doped regions and a surface of said polysilicon gate electrode to amorphous silicon layers between said step e) and said step f), and said amorphous silicon layers are covered with said metal layer.

7. The process as set forth in claim 1, in which said field insulating layer further defines another narrow active area having a first conductivity type opposite to a second conductivity type of said narrow active area, and said another narrow active area and said narrow active area are respectively assigned to a first field effect transistor and a second field effect transistor, said process further comprising the steps of
   h) forming a first gate insulating layer and a second gate insulating layer in said another narrow active area and said narrow active area, respectively, between said step b) and said step c),
   i) forming a first polysilicon gate electrode and a second polysilicon gate electrode on said first gate insulating layer and said second gate insulating layer, respectively, between said step h) and said step c),
   j) forming a second ion-implantation mask in such a manner as to cover said narrow active area and said wide inactive area therewith and uncover said another narrow active area therewith between said step i) and said step c),
   k) lightly ion implanting a second dopant impurity into said another narrow active area so as to form second doped regions of said second conductivity type in a self-aligned manner with said first polysilicon gate electrode between said step j) and said step c),
   l) removing said second ion-implantation mask between said step k) and said step c),
   m) forming a third ion-implantation mask in such a manner as to cover said another narrow active area and said wide inactive area therewith and uncover said narrow active area therewith between said step l) and said step c),
   n) lightly ion implanting a third dopant impurity into said narrow active area so as to form third doped regions of said first conductivity type in a self-aligned manner with said second polysilicon gate electrode between said step m) and said step c),
   o) removing said third ion-implantation mask between said step n) and said step c),
   p) forming first side wall spacers and second side wall spacers on both sides of said first polysilicon gate electrode and both sides of said second polysilicon gate electrode, respectively, between said step o) and said step c),
   q) forming a fourth ion-implantation mask in such a manner as to cover said narrow active area and said wide inactive area therewith and uncover said another narrow active area therewith between said step p) and said step c), r) heavily ion implanting a fourth dopant impurity into said another narrow active area so as to form fourth doped regions of said first conductivity type in a self-aligned manner with said first side wall spacers between said step q) and said step c), and s) removing said fourth ion-implantation mask between said step r) and said step c), and said first doped regions of said first conductivity type are self-aligned with said second side wall spacers.

8. The process as set forth in claim 7, further comprising the step of converting a surface of said first doped regions to amorphous silicon layers between said step e) and said step f).

9. The process as set forth in claim 1, in which said metal layer is formed of titanium.

10. The process as set forth in claim 1, in which said first ion-implantation mask is formed by using photo-lithographic techniques.

11. The process as set forth in claim 1 wherein said silicon substrate is prepared on a silicon wafer, said scribe lines provided on said silicone wafer and defining a plurality of chips, and wherein said inactive area further includes a peripheral surface area of said silicon wafer which is not part of any of said plurality of chips.

12. A process for fabricating a semiconductor device, comprising the steps of:

a) preparing a silicon substrate on a silicon wafer, said silicon wafer having scribe lines defining a plurality of chips;

b) selectively forming a field insulating layer on a major surface of said silicon substrate so as to define a narrow active area assigned to a circuit component and a wide inactive area not assigned to any circuit component positioned either above or below said field insulating layer, said wide inactive area defined by a peripheral surface area of said silicon wafer which is not part of any of said plurality of chips and performing additional process steps without ion-implantation into said wide inactive area, said additional process steps including:

c) forming a first ion-implantation mask on said major surface so as to cover said wide inactive area therewith and uncover said narrow active area therewith;

d) ion implanting a first dopant impurity into said narrow active area so as to form first doped regions forming parts of said circuit component;

e) removing said first ion-implantation mask;

f) depositing a metal layer on at least said first doped regions;

g) causing said metal layer to react with the silicon of said first doped regions under application of heat for forming conductive metal silicide layers.

* * * * *